US009209062B1

United States Patent
Kukas

(10) Patent No.: US 9,209,062 B1
(45) Date of Patent: Dec. 8, 2015

(54) REMOVABLE SPIN CHAMBER WITH VACUUM ATTACHMENT

(71) Applicant: Spintrac Systems, Inc., Santa Clara, CA (US)

(72) Inventor: Alan W. Kukas, Santa Clara, CA (US)

(73) Assignee: Spintrac Systems, Inc., Santa Clara, CA (US)

( * ) Notice: Subject to any disclaimer, the term of this patent is extended or adjusted under 35 U.S.C. 154(b) by 87 days.

(21) Appl. No.: 14/288,607

(22) Filed: May 28, 2014

(51) Int. Cl.
| | |
|---|---|
| B05C 13/02 | (2006.01) |
| H01L 21/683 | (2006.01) |
| B05C 11/08 | (2006.01) |
| H01L 21/687 | (2006.01) |
| B05D 1/00 | (2006.01) |
| B05C 9/12 | (2006.01) |
| G03F 7/16 | (2006.01) |

(52) U.S. Cl.
CPC ............ *H01L 21/6838* (2013.01); *B05C 11/08* (2013.01); *B05C 13/025* (2013.01); *H01L 21/68785* (2013.01); *B05C 9/12* (2013.01); *B05D 1/005* (2013.01); *G03F 7/162* (2013.01); *Y10S 414/135* (2013.01)

(58) Field of Classification Search
CPC ..................... H01L 21/6838; H01L 21/68785; G03F 7/162; G03F 7/3021; B25B 11/005; Y10S 409/903; Y10S 414/135; B05D 1/005; B08B 1/04; B05C 9/12; B05C 11/08; B05C 13/025
USPC ............................... 118/56, 501, 319; 269/21
See application file for complete search history.

(56) References Cited

U.S. PATENT DOCUMENTS

| | | | | | |
|---|---|---|---|---|---|
| 3,902,857 | A | * | 9/1975 | Vander Mey | .......... B01J 19/247 261/90 |
| 3,990,689 | A | * | 11/1976 | Eklund, Sr. | ............ B23Q 1/623 269/21 |
| 4,838,979 | A | * | 6/1989 | Nishida | ................... B05C 11/10 118/320 |
| 4,889,069 | A | * | 12/1989 | Kawakami | .............. B05C 11/08 118/50 |
| 4,941,426 | A | * | 7/1990 | Sago | ........................ G03F 7/162 118/50 |
| 4,955,590 | A | * | 9/1990 | Narushima | .......... H01L 21/6838 269/21 |
| 5,069,156 | A | | 12/1991 | Suzuki | |
| 5,116,250 | A | * | 5/1992 | Sago | ................... H01L 21/6715 118/320 |
| 5,211,753 | A | * | 5/1993 | Swain | ..................... B05C 11/08 118/320 |
| 5,234,499 | A | | 8/1993 | Sasaki et al. | |
| 5,358,740 | A | * | 10/1994 | Bornside | ............. H01L 21/6715 118/52 |

(Continued)

*Primary Examiner* — Karl Kurple
(74) *Attorney, Agent, or Firm* — Thomas Schneck

(57) ABSTRACT

A removable air flow control housing having a chamber for holding a substrate which is rotatable with and attachable by vacuum to a spin chuck of a spin coating apparatus. The housing has a lid in a top wall that can be hinged, screwed, magnetically secured or frictionally held in place. The chuck is nestable within a cutout region disposed within a central inner portion of the housing while an outer portion of the housing has a toroidal shape beyond edges of the chuck for reducing air turbulence and capturing excess coating fluid. The cutout region forms a shape that corresponds to the chuck shape. An upper cutout wall has vacuum holes in vertical alignment with vacuum holes of the chuck. The housing is attachable by vacuum to the chuck when the chuck is nested within the cutout region and the substrate is positioned on an upper surface of the upper cutout wall. The housing and substrate are rotatable with the chuck about a chuck axis of rotation as a coating solution is dispensed onto the substrate.

15 Claims, 3 Drawing Sheets

(56) References Cited

U.S. PATENT DOCUMENTS

| | | | |
|---|---|---|---|
| 5,626,675 A * | 5/1997 | Sakamoto | H01L 21/6715 118/500 |
| 5,656,082 A | 8/1997 | Takatsuki et al. | |
| 5,688,322 A | 11/1997 | Motoda et al. | |
| 5,962,193 A * | 10/1999 | Lin | B05C 11/08 118/52 |
| 5,997,653 A * | 12/1999 | Yamasaka | B08B 3/02 134/102.1 |
| 6,241,402 B1 * | 6/2001 | Sakamoto | G03F 7/3021 118/52 |
| 6,261,635 B1 * | 7/2001 | Shirley | H01L 21/6715 427/240 |
| 6,306,455 B1 * | 10/2001 | Takamori | H01L 21/67248 118/52 |
| 6,576,055 B2 | 6/2003 | Shirley | |
| 6,780,233 B1 * | 8/2004 | Leigh | C09D 4/00 106/285 |
| 8,770,143 B2 * | 7/2014 | Endo | C23C 16/4412 118/326 |
| 2001/0003965 A1 | 6/2001 | Sada et al. | |
| 2004/0180142 A1 * | 9/2004 | Kobayashi | B05D 1/005 427/240 |
| 2004/0206452 A1 * | 10/2004 | Okuda | B08B 1/04 156/345.11 |
| 2007/0116459 A1 * | 5/2007 | Takeguchi | B08B 3/04 396/604 |
| 2007/0256632 A1 * | 11/2007 | Pham | H01L 21/68728 118/52 |
| 2010/0122773 A1 * | 5/2010 | Noh | H01L 21/6715 156/345.29 |
| 2012/0276753 A1 * | 11/2012 | Yoshihara | H01L 21/6715 438/782 |

* cited by examiner

REMOVABLE SPIN CHAMBER WITH VACUUM ATTACHMENT

TECHNICAL FIELD

The invention relates generally to a spin coating apparatus and, in particular, to an airflow control housing for use with a spin coating apparatus.

BACKGROUND ART

Various spin coating apparatuses that apply thin films using coating solutions such as photoresist to rotating substrates such as wafers, are well known. A coating solution is spread over the wafer by centrifugal force to form a thin film. During the coating process, a solution, for example a photoresist solution comprising a solvent and a photoresist resin, is deposited on the central portion of the substrate and is dispersed from the central substrate portion to a peripheral substrate portion as the substrate is rotated on the spin chuck, thereby forming a thin film over the substrate. When a substrate is non circular, such as a rectangular substrate, a layer of photoresist having thicker corners or "fringes" tends to form. This is thought to be formed by a turbulent air flow adjacent to the spinning substrate. Air contacting the top surface of the rotating substrate is driven to form a nonturbulent air flow caused by the substrate and the air which contacts it. This nonturbulent air flow moves in the same direction as the rotating substrate. However, the side surface of the spinning substrate causes another air flow that is turbulent when the substrate is noncircular. When the substrate is circular, the air flow is parallel to the side wall and does not typically interfere with the air flow of the top surface. When the substrate is non circular, for example rectangular, the side walls cause air flows of different directions and speeds generating the turbulent flow disturbing the top nonturbulent air flow resulting in "fringes" at the corners of the substrate.

Also, during dispersion of the photoresist solution from the central portion to the peripheral portion of a square or large round rotating substrate, the solvent in the resist tends to evaporate quicker towards the ends of the substrate resulting in a varying thickness of the photoresist layer.

It is desired to provide a uniform thickness of a material applied by spin coating. The following are examples of spin coating apparatuses devised to provide a uniform thickness of a coating film. U.S. Pat. No. 5,069,156 to Suzuki discloses a spin coating apparatus including a rotatable support for a non circular substrate that is coaxially fixed to an annular member having an inward overhanging inward wall. The annular member assists in suppressing undesirable aerodynamic forces exerted on a photoresist film by turbulent air flow that occurs during rotation of the substrate.

U.S. Pat. No. 6,576,055 to Shirley discloses an apparatus for forming a uniform liquid layer on a substrate. In one embodiment, the apparatus includes a support that engages less than the entire surface of the substrate and a barrier that can extend over the upper surface of the substrate and rotate at the same rate of the substrate to separate a rotating air mass within the barrier from a stationary air mass external to the barrier. A prior art apparatus is also disclosed that has a cover releasably placed on the chuck to rotate with the chuck and substrate. The cover includes an aperture that allows fluid to pass from the fluid supply to the substrate.

U.S. Pat. No. 5,688,322 to Motoda et al. discloses an apparatus for coating resist comprising a spin-chuck capable of rotating and holding a substrate and a rotating cup surrounding the held substrate and rotated in synchronism with the spin chuck. A cover is provided over the rotating cup and in a center bottom portion of the rotating cup an opening portion is formed. At the peripheral edge of the opening portion the upper peripheral edge of a rotating collar is connected. The rotating collar is connected to a driving pulley driven by a spin motor. The spin chuck and rotating chuck are rotated in a synchronized manner. Between the upper surface of the bottom portion of the rotating cup and the lower surface of the spin chuck, a sealing mechanism is provided.

U.S. Pat. No. 5,234,499 to Sasaki et al. discloses a spin coating apparatus including a rotary table having a boss under its central surface fitting over a rotary shaft. The rotary table carriers a spacer ring and a ring plate connecting an upper rotary plate to the rotary table. An upper support plate is detachably attached to the ring plate by knob bolts and is bolted to the upper rotary plate beneath it. The rotary table and upper rotary plate form a substrate treating space with peripheral openings allowing a part of the coating solution to scatter outwardly therefrom.

U.S. Pat. No. 5,656,082 to Takatsuki et al. discloses a liquid applying apparatus that includes a rotary member having a table for supporting a substrate and a cover movable above the table and operable to define a closed space in combination with the disk table. A sealing arrangement including a sealing ring and a ring accommodation groove is provided between the disk table and the cover member to seal the closed space.

U.S. Patent Application Publication No. 2001/000395 to Sada et al. discloses a coating processing apparatus with a rotating cup having an opening portion on the top thereof for housing a substrate, a spin chuck for rotating the substrate in the rotating cup, and a lid body having an opening for dispensing resist and attached to the rotating cup. The bottom surface of the rotating cup has a central opening therein through which an axial spin drive extends which is connected to the bottom surface.

Though many devices are known for providing a uniform film thickness, what is desired is a device which is easily affixed to different spin coating apparatuses.

It is an object to provide an apparatus that will minimize "fringe" formation and/or edge buildup.

It is another object to provide an apparatus that will provide a uniform or substantially uniform coating film on a substrate.

SUMMARY OF THE INVENTION

An embodiment of the invention comprises an air flow control housing with a substrate holding chamber having a central cutout region within which a vacuum spin chuck of a spin coating apparatus is nestable and being rotatable with and removably attachable via a vacuum to the spin chuck. The air flow control housing includes a central inner cutout region formed by housing surfaces that embrace top and side surfaces of the spin chuck, while the outer periphery of the housing is toroidal allowing radially outwardly flowing air with room to dissipate. The chamber is accessible through an opening in a top wall of the housing for substrate placement. The housing includes a lid movable to provide substrate access to the opening, an outer side wall extending downwardly from the top wall, a bottom wall and cutout walls including an upper cutout wall and a side cutout wall extending from the upper cutout wall defining the central inner cutout. An ambient air environment is initially provided in the housing but pressure can be reduced after closing the lid. The upper cutout wall has an upper surface on which the substrate is positionable and vacuum holes therethrough. The vacuum holes of the upper cutout wall are in vertical alignment with vacuum holes of the spin chuck for the purpose of holding a substrate in place during spinning. The upper cutout wall is placed on the spin chuck and the housing is secured to the spin chuck when the substrate is secured to the upper surface of the cutout wall via a vacuum. The secured housing and substrate, closely spaced from but not contacting the lid, are rotatable with the spin chuck about a spin chuck axis as a solution is dispensed to the substrate through a smaller opening in the lid to coat the substrate.

The housing is advantageous for at least the reason that it provides for a more uniform spin coated layer by air flow control. Air flow parallel to the side wall of the substrate is driven by the closely spaced side cutout wall in the same rotating direction. This leads to a reduction in turbulent air flow and the more uniform spin coated layer.

Also, the housing is advantageous for at least the additional reason that it is easily affixed to various spin coating apparatus.

DETAILED DESCRIPTION OF THE INVENTION

With reference to FIGS. 1-4 there is seen an air flow control housing 100 receiving a spin chuck 122 of a spin coating apparatus 134. As mentioned above, a coating solution is to be spread over a substrate by centrifugal force to form a thin film. The coating solution must be applied in an excessive amount with the excess captured at the outer periphery of the substrate. In one example, the housing is comprised of a Teflon material, however other materials may be used. In one example the housing 100 is comprised of one piece. In another example, it is comprised of more than one piece. The housing dimensions are, for example, sufficient for treating wafers of diameters from 4-18 inches.

Figure 1:
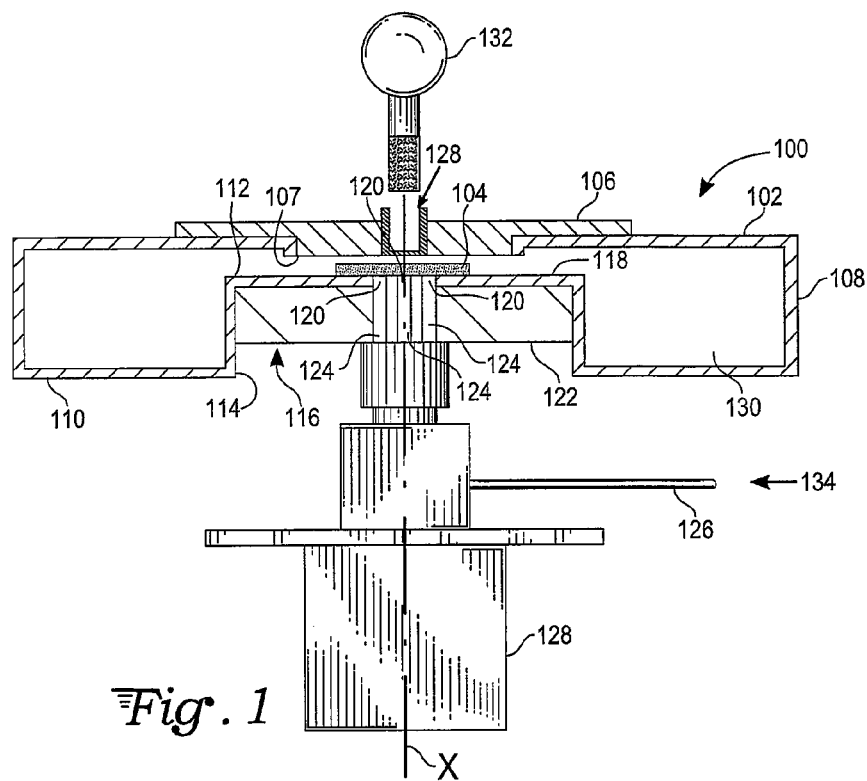
FIG. 1 is a front cross sectional view of a housing for an embodiment of the present invention on a spin chuck.
Figure 2:
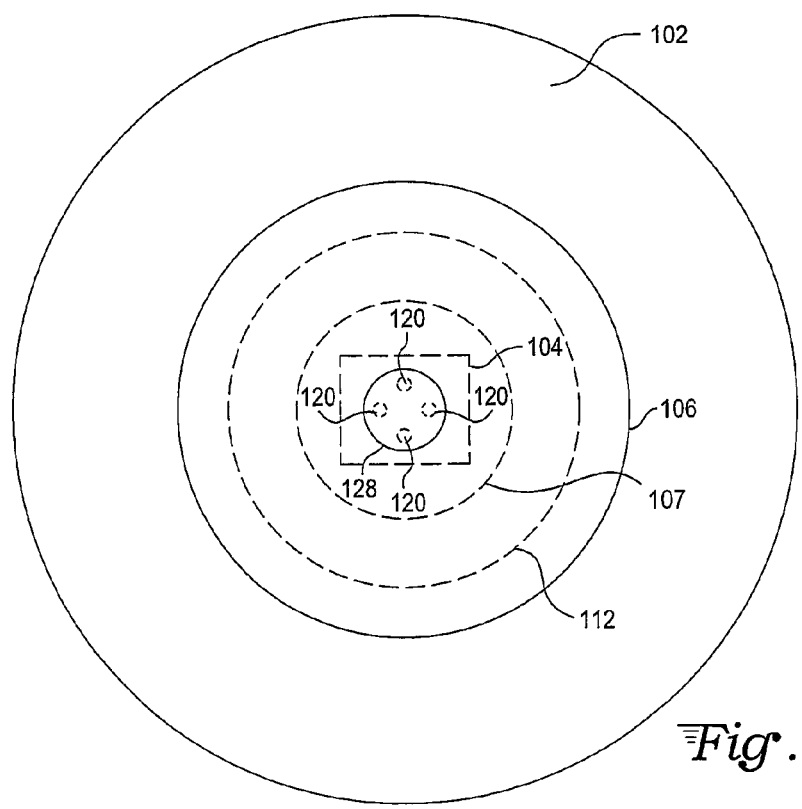
FIG. 2 is a top plan view of the housing of FIG. 1.
Figure 3:
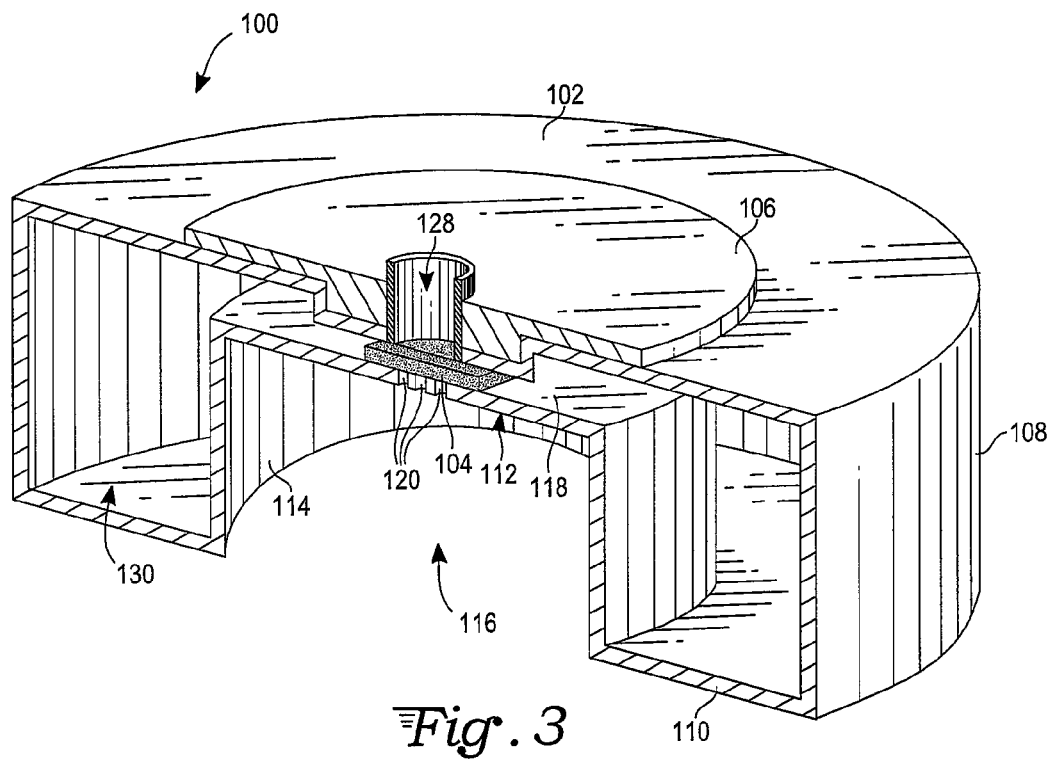
FIG. 3 is a cutaway perspective view of the housing of FIG. 2.
Figure 4:
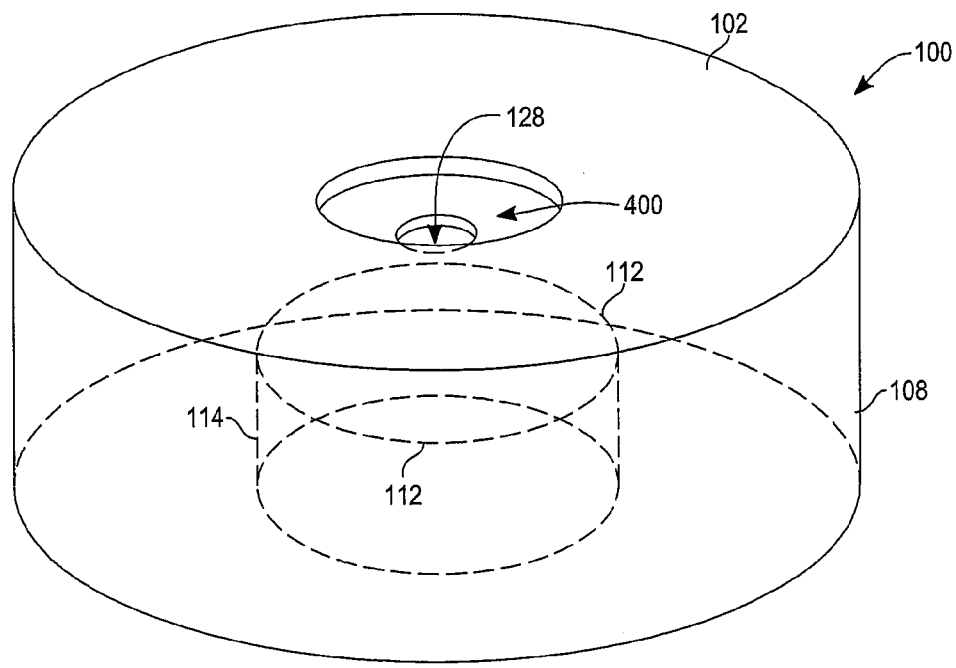
FIG. 4 is a perspective view of the housing of FIG. 2.

Referring to FIGS. 1 and 3, the housing features a chamber 130 formed by a top wall 102, an outer side wall 108 extending downwardly from top wall 102, a bottom wall 110 and cutout walls including an upper cutout wall 112 and a side cutout wall 114. An outer periphery of the housing is formed by the bottom wall, the top wall, the outer side wall, and the cutout walls, the toroidal chamber 130, used to capture excess coating solution and to provide a large bulbous air receiving zone that prevents air backflow onto the substrate by forming eddies in the zone. The top wall 102 includes an opening 400 (FIG. 4) for a substrate 104 (FIG. 1). In one example, the top wall 102 of the housing is circular and the side wall 108 is cylindrical. The upper cutout wall 112 and side cutout wall 114 define a cutout region 116 (FIG. 3) of the housing 100.

Referring to FIGS. 1 and 3, the cutout region 116 is shaped to receive the spin chuck 122. In the depicted example, the spin chuck 122 is cylindrically shaped and the cutout region is also cylindrically shaped so that the spin chuck may nest within the cutout region. In the depicted example, the upper cutout wall 112 is circular in shape and the side cutout wall 114 is cylindrical in shape. The cutout region 116 is, for example, formed in an inner central portion of the housing 100. In an example where the spin chuck is rectangular in shape, the upper cutout wall could be rectangular in shape and the side walls extending from the upper cutout wall would be of a shape to receive the side walls of the cutout region which in one example could be square or rectangular shaped side walls.

With reference to FIGS. 1 and 3, the upper cutout wall 112 includes an upper surface 118 (FIG. 3) on which the substrate 104 is positionable. The upper cutout wall 112 includes a plurality of vacuum holes 120 extending therethrough. When the lid 106 is movable to reveal the opening, the substrate 104 may be placed on the upper surface to cover vacuum holes 120. Vacuum holes 120 are in an arrangement that corresponds to an arrangement of vacuum holes 124 of the spin chuck. As seen in FIG. 1, vacuum holes 120 are in vertical alignment with vacuum holes 124 and serve to securely hold the substrate 104 in place.

In the example shown in FIG. 3, the dimensions of the cutout 116 are substantially the same as or only slightly larger than the spin chuck such that the spin chuck is in a tight nesting relation or receivable in the cutout region. For example, the upper surface 118 has a diameter slightly larger than at a diameter of an upper surface of the spin chuck 122 and side wall 114 has a height slightly larger than a height of the spin chuck. The upper surface 118 is only a few millimeters from the lower surface of the lid 106 but there is sufficient clearance for substrate 104 to spin without contacting the lid, on the order of millimeters but less than 2 centimeters. In another example, the dimensions of the cutout region 116 could be larger or substantially larger than the dimensions of the spin chuck.

With reference to FIGS. 1-7, lid 106 is movable to provide access to opening 400 (FIG. 4) for the substrate 104 (FIGS. 1, 3 and 5-7) and to close the opening. The lid 106 may include a central plug portion 107 associated with the top wall that extends lower than the rest of the lid, in a step configuration, that is insertable within opening 400 to close the opening and removable to provide access to the opening 400. The opening 400 is of a size that allows the substrate 104 to be positioned in the chamber. Within the lid is an opening 128 (FIGS. 1 and 3) for dispensation of a coating solution such as a photoresist solution. The opening 128 is smaller than opening 400. A coating solution dispenser, such as a photoresist coating solution dispenser 132, seen in FIG. 1, is configurable to dispense the coating solution within the opening 128.

In operation, the housing 100 is placed on the spin chuck 122, seen in FIGS. 1 and 5-7, such that the spin chuck 122 is received by and nested within the cutout 116. The lid 106 is movable to revealing the opening 400 and the substrate 104 is inserted via the opening 200 and placed on the upper surface 118 of the housing 100. The substrate 104 may be positioned on the upper surface 118 via tweezers or a robotic handler. The substrate 104 is securable to the housing and the spin chuck via a vacuum. A vacuum may be applied via a vacuum source 126, seen in FIG. 1, to secure the substrate 104 to the upper surface 118 of wall 120, and in the housing 100 of which the wall 120 is a part of, to the spin chuck 122. When the lid 106 is closed a motor 128, seen in FIG. 1, is operable to cause the spin chuck 122 and vacuum attached housing 100 and substrate 104 to rotate with the spin chuck 122 about a spin chuck axis X of a typical rotation rate of, for example, 3600 rpm. The lowermost portion of lid 106 is only a few millimeters above substrate 104. The substrate is centered on the spin axis by an alignment device. The housing 100 and the spin chuck 122 rotate coaxially. As the spin chuck 122 and attached housing 100 holding the substrate 104 are rotating, or prior to rotation, a coating solution, such as a photoresist coating solution, is dispensed with coating dispenser 132 into the opening 128 so that that substrate 104 may be coated with the coating solution by centrifugal force of spin chuck rotation. Excess coating material flows off of the substrate and is collected in the chamber 130.

Figure 5:
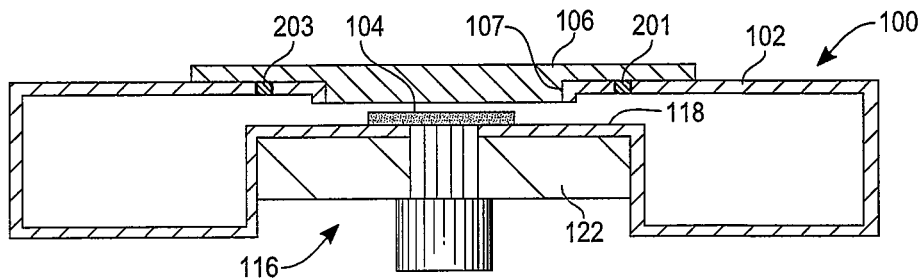
FIGS. 5-7 are side views of alternate housing for a spin chuck as shown in FIG. 1.

In the alternate embodiment of FIG. 5, the lid 106 is secured to top wall 102 of housing 100 by a plurality of magnets 201, 203 that are embedded in top wall 102. The lid 106 should be a ferromagnetic material, such as steel, to cooperate with the magnets. A sufficient number of circumferentially spaced apart magnets are used to keep lid 106 in place during spinning. The lid tightly closes the top wall 102 and will not move during spinning. Note that the lid 106 has a step or plug portion 107 that allows self-centering of the lid.

Figure 6:
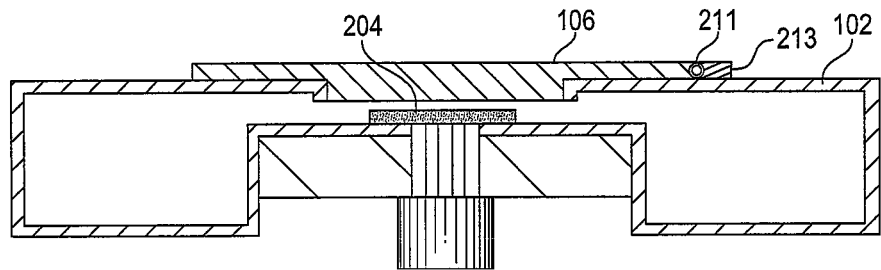

In the alternate embodiment of FIG. 6, the lid 106 has a hinge 211 associated with a hinge block 213 that is fixed to top wall 102. The lid 106 pivots upwardly to open the housing for ingress and egress of substrate 104, as well as for dispensing coating solution. A closure, not shown, secures the lid in place. Fluid is dispensed onto the substrate before the lid is closed.

Figure 7:
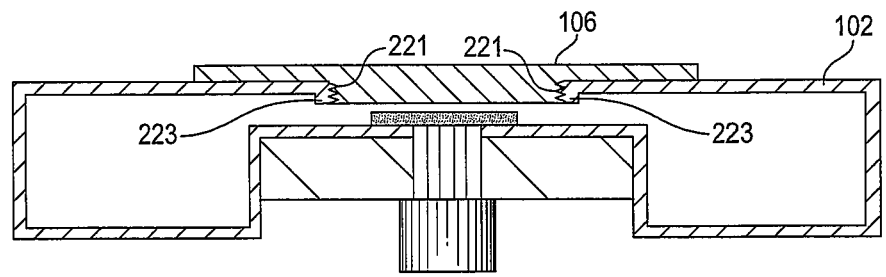

In the alternate embodiment of FIG. 7, the lid 106 has screw threads 221 that engage corresponding threads 223 in top wall 102 in a region where there is a step in the top wall. The direction of the threads is such that upon spinning of the housing, the threads are tightened by centrifugal force. Dispensing of fluid coating is done before the lid is secured.

The housing 100 is advantageous for at least the reason that it reduces or prevents the formation of "fringes" on substrate corners or uneven coating layers by air flow control over a rotating substrate next to a closely spaced lid whereby turbulence is reduced at edges of the substrate. It is a portable attachment device that is attachable to spin chucks of various coating apparatuses and can be removed from the spin chuck when a spin coating is complete, with replacement with a new housing and a new substrate.

What is claimed is:

1. A spin chamber located in a spin coating apparatus for applying a coating solution to form a film on a surface of a substrate, the spin chamber comprising: a removable air flow control housing having a top wall with an opening for the substrate, a lid movable to provide access to the opening for the substrate, an outer side wall extending downwardly from the top wall, and a bottom wall, all defining a toroidal overflow chamber, and said removable air flow control housing includes an inner central portion, said inner central portion having cutout walls including an upper cutout wall and a side cutout wall extending from the upper cutout wall defining a cutout region, the upper cutout wall having an upper surface with vacuum holes on which the substrate is positionable, the upper cutout wall has a flat portion configured to support the substrate, said flat portion of the upper cutout wall has a length dimension greater than the diameter of the substrate, the cutout region having dimensions larger than dimensions of a spin chuck having vacuum holes so that the spin chuck is receivable within the cutout region, wherein the vacuum holes of the upper cutout wall are in vertical alignment with vacuum holes of the spin chuck when the upper cutout wall is placed on the spin chuck, the spin chuck is configured to secure the housing to the spin chuck with a vacuum when the substrate is secured to the upper surface of the cutout wall, the substrate being spaced apart from the lid, and the housing is configured to rotate with the spin chuck about a spin chuck axis.

2. The apparatus of claim 1, wherein the side cutout wall is cylindrical.

3. The apparatus of claim 1, wherein the spin chuck is circular and the upper cutout wall is cylindrical and the upper cutout wall has a diameter at least as large as the spin chuck diameter.

4. The apparatus of claim 1, wherein the upper cutout wall has a surface shape corresponding to a surface shape of the spin chuck.

5. The apparatus of claim 1, wherein the lid is hinged in relation to the top wall.

6. The apparatus of claim 1, wherein the lid is magnetically secured to the top wall.

7. The apparatus of claim 1, wherein the lid has screw threads engaging mating threads in a step portion of the top wall.

8. The apparatus of claim 1, wherein the lid has a opening wherein a fluid dispenser is seated.

9. The apparatus of claim 1, wherein the cutout region is disposed in an inner central position of the housing in nesting relation with the spin chuck.

10. A spin coating apparatus for use in applying a coating solution to form a film on a surface of a substrate, the spin coating apparatus comprising: a removable air flow control housing having a top wall with an opening, a lid for the opening, and cutout walls defining a central cutout region shaped to have nested a vacuum spin chuck therein, the cutout walls including a substrate support cutout wall having an arrangement of vacuum holes extending through the substrate support cutout wall corresponding to an arrangement of vacuum holes extending through the vacuum spin chuck, and a peripheral fluid overflow chamber, the substrate support cutout wall has a flat portion configured to support the substrate, said flat portion of the substrate support cutout wall has a diameter greater than the diameter of the substrate, wherein the vacuum spin chuck is configured to secure the removable air flow control housing and the substrate support cutout wall is configured to secure a substrate via a vacuum communicating with the vacuum holes when a substrate is positioned on the substrate support cutout wall spaced below the lid and the vacuum spin chuck is nested within the central cutout region and wherein the removable air flow control housing secured by the vacuum and substrate are rotatable with the vacuum spin chuck about a spin chuck rotation axis.

11. The apparatus of claim 10, wherein the central cutout region has dimensions slightly larger than the spin chuck dimensions.

12. The apparatus of claim 10, wherein the lid is hinged in relation to the top wall.

13. The apparatus of claim 10, wherein the lid is magnetically secured to the top wall.

14. The apparatus of claim 10, wherein the lid has screw threads engaging mating threads in a step portion of the top wall.

15. The apparatus of claim 10, wherein the lid has an opening wherein a fluid dispenser is seated.

* * * * *